(12) United States Patent
Cook et al.

(10) Patent No.: US 9,976,230 B2
(45) Date of Patent: May 22, 2018

(54) METHOD FOR FORMING A SCRATCH RESISTANT CRYSTALLIZED LAYER ON A SUBSTRATE AND ARTICLE FORMED THEREFROM

(71) Applicant: CORNING INCORPORATED, Corning, NY (US)

(72) Inventors: Glen Bennett Cook, Elmira, NY (US); Ann MeeJin Ferrie, Painted Post, NY (US); Shawn Michael O'Malley, Horseheads, NY (US); Vitor Marino Schneider, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 182 days.

(21) Appl. No.: 14/853,191

(22) Filed: Sep. 14, 2015

(65) Prior Publication Data

US 2016/0083863 A1  Mar. 24, 2016

Related U.S. Application Data (60) Provisional application No. 62/052,690, filed on Sep. 19, 2014.

(51) Int. Cl.
| | | |
|---|---|---|
| *C30B 13/00* | (2006.01) | |
| *C30B 29/20* | (2006.01) | |
| *C23C 18/12* | (2006.01) | |
| *C03C 17/25* | (2006.01) | |

(52) U.S. Cl.
CPC .............. *C30B 13/00* (2013.01); *C03C 17/25* (2013.01); *C23C 18/1216* (2013.01); *C23C 18/1241* (2013.01); *C23C 18/1245* (2013.01); *C23C 18/1254* (2013.01); *C23C 18/1295* (2013.01); *C30B 29/20* (2013.01); *C03C 2217/214* (2013.01); *C03C 2218/113* (2013.01); *C03C 2218/116* (2013.01); *C03C 2218/32* (2013.01)

(58) Field of Classification Search
None
See application file for complete search history.

(56) References Cited

U.S. PATENT DOCUMENTS

| | | | |
|---|---|---|---|
| 4,046,618 A † | 9/1977 | Chaudhari | |
| 5,350,607 A | 9/1994 | Tyson et al. | |
| 6,111,821 A | 8/2000 | Bach | |
| 8,404,366 B2 | 3/2013 | Ahn et al. | |
| 9,073,781 B2 * | 7/2015 | Nadaud | C03C 17/09 |
| 9,461,239 B2 * | 10/2016 | Chen | H01L 41/314 |
| 2011/0017659 A1 * | 1/2011 | Aktas | C23C 16/403 |
| | | | 210/500.1 |
| 2012/0295397 A1 * | 11/2012 | Koezuka | H01L 29/78693 |
| | | | 438/104 |
| 2013/0009147 A1 * | 1/2013 | Koyama | H01L 21/02422 |
| | | | 257/43 |
| 2013/0186455 A1 † | 7/2013 | Liu | |
| 2013/0236699 A1 | 9/2013 | Prest et al. | |
| 2013/0309613 A1 | 11/2013 | O'Malley et al. | |
| 2014/0139978 A1 | 5/2014 | Kwong | |
| 2014/0193606 A1 | 7/2014 | Kwong | |
| 2015/0132541 A1 * | 5/2015 | McDonald | B23K 26/0081 |
| | | | 428/155 |
| 2015/0132563 A1 | 5/2015 | O'Malley et al. | |
| 2015/0270116 A1 * | 9/2015 | Honda | H01J 63/06 |
| | | | 250/504 R |

FOREIGN PATENT DOCUMENTS

| | | |
|---|---|---|
| EP | 700879 A | 3/1996 |
| EP | 1561839 | 8/2005 |
| WO | 2005091021 | 9/2005 |

OTHER PUBLICATIONS

International Search Report and the Written Opinoin of the International Searching Authority; PCT/US2015/050587; dated Jan. 5, 2016.
Stollberg et al; "Nanohardness and Fracture Toughness of Combustion Chemical Vapor Deposition Deposited Yittria Stabilized Zirconia-Alumina Films"; Thin Solid Films, vol. 483, No. 1-2; Jul. 1, 2005, pp. 211-217.
Fu, Qiang et al, "Preparation of alumina films from a new sol-gel route" Thin Solid films 348, pp. 99-102 (1999).
N. Bahlawane—Novel sol-gel process depositing a-Al2O3 for the improvement of graphite oxidation-resistance—Thin Solid Films, vol. 396, pp. 126-130, 2001.
R. Stosser and G. Scholz—Magnetic Resonance investigation of the process of corundum formation starting from sol-gel precursors, J. Am. Ceram. Soc, vol. 88, No. 10, pp. 2913-2922, 2005.
C. Pflitsch, R. A. Siddiqui, C. Eckert and B. Atakan—Sol-gel deposition of chromium doped aluminum oxide films (Ruby) for surface temperature sensor application, Chem. Mater., vol. 20, pp. 2773-2778, 2008.
M. A. Aegerter and Martin Mennig—Sol-gel technologies for glass producers and users—Chapter 4.1.8—Scratch resistant coatings (G. Helsch and G. H. Frischat), pp. 217-221, Kluwer Academic Publishers, 2004.

(Continued)

*Primary Examiner* — Marc S Zimmer
(74) *Attorney, Agent, or Firm* — John T. Haran (57) ABSTRACT

A crystallized layer can be formed on a substrate from a precursor layer deposited on a surface of the substrate. The precursor layer can be an oxide, a nitride, a carbide, or an oxynitride. The process for forming the crystallized layer includes melting the precursor layer formed on the surface of the substrate by localized topical heating of the precursor layer and then cooling the melted precursor layer so that it crystallized to form a scratch resistant crystallized layer. The scratch resistant crystallized layer can have a hardness of 15 GPa or greater.

35 Claims, 5 Drawing Sheets

(56) References Cited

OTHER PUBLICATIONS

M. Dessler, M. Nofz, P. Klobes, I. Dorfel and S. Reinsch—Differences between films and monoliths of sol-gel derived aluminas, Thin Solid Films, vol. 519, pp. 42-51, 2010.
Hauk—Sol-gel preparation of scratch-resistant Al2O3 coatings on float glass, Glass Science and Technology: Glastechnische Berichte, 72(12), pp. 386, 1999.

\* cited by examiner
† cited by third party

METHOD FOR FORMING A SCRATCH RESISTANT CRYSTALLIZED LAYER ON A SUBSTRATE AND ARTICLE FORMED THEREFROM

CROSS-REFERENCE TO RELATED APPLICATIONS

This application claims the benefit of priority under 35 U.S.C. § 119 of U.S. Provisional Application Ser. No. 62/052,690 filed on Sep. 19, 2014 the content of which is relied upon and incorporated herein by reference in its entirety.

BACKGROUND

Field

The disclosure relates to a method for forming a crystallized layer on a substrate and articles having such a crystallized layer, and more particularly to locally and rapidly heating a precursor layer on a substrate and then allowing the melted precursor layer to cool and form a scratch resistant crystallized layer.

Technical Background

The scratch resistance of a substrate can be of importance in terms of both aesthetic appearance and, when the substrate is transparent, the ability to see through the substrate. However, substrate materials with suitable scratch resistance can be expensive to make in comparison to less scratch-resistant alternatives. There is a need for imparting improved scratch resistance to inexpensive substrate materials by adding a coating or layer to the substrate that has a higher degree of scratch resistance than the substrate.

SUMMARY

In some embodiments, a method for forming a crystallized layer includes melting a precursor layer formed on a surface of a substrate, wherein the precursor layer is selected from the group consisting of an oxide, a nitride, a carbide, and an oxynitride. The melting can include localized topical heating of the precursor layer. The method can also include cooling the melted precursor layer so that it crystallized to form a crystallized layer.

In other embodiments, a method for forming a crystallized layer includes depositing an oxide layer on a substrate, localized topical heating of the oxide layer to melt the oxide layer, and cooling the melted oxide layer so that it crystallizes to form a crystallized layer.

In further embodiments, disclosed herein is an article having a substrate and a crystallized layer comprising corundum and having a hardness of 15 GPa or greater formed on a surface of the substrate.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the present preferred embodiment(s), an example of which is/are illustrated in the accompanying drawings. Whenever possible, the same reference numerals will be used throughout the drawings to refer to the same or like parts.

Substrates with a scratch resistant crystallized oxide, carbide, nitride, or oxynitride layer have utility in a variety of industries including cover substrates for mobile electronic devices (for example, smart phones, laptops, or tablets), display substrates electronic devices (for example, televisions), windshields or windows for the transportation industry (for example, automobiles and airplanes), architectural glass, mirrors, and solar panels. In each of the above industries, scratch resistance and hardness of the crystallized layer is needed to prevent scratches, indentations, or other marks that impair the aesthetics of the layer and/or the visibility of the underlying substrate through the crystallized layer. Disclosed herein are processes for obtaining such crystallized layers and articles having such crystallized layers.

Figure 1:
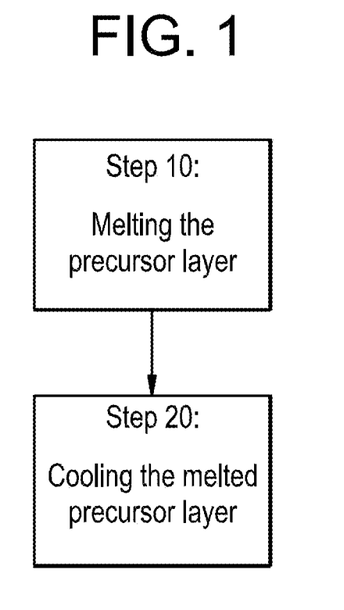
FIG. 1 is a flowchart of an exemplary process for making a scratch resistant crystallized layer.
Figure 2:
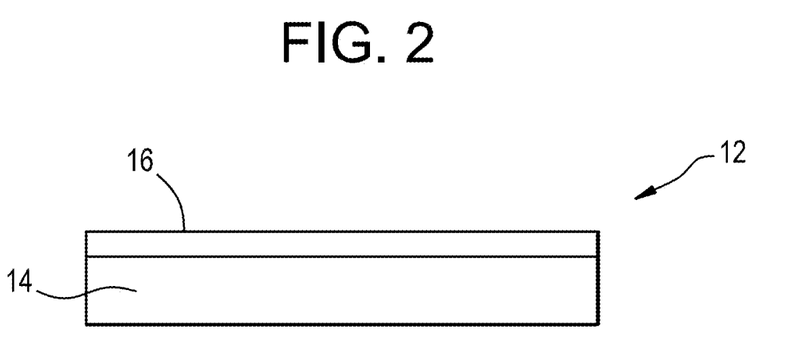
FIG. 2 is a side view of an exemplary article having a scratch resistant crystallized layer.

In some embodiments, as shown for example in FIG. 1, the process of forming a crystallized layer can include a step 10 of melting a precursor layer formed on a surface of a substrate, wherein the precursor layer is an oxide, a nitride, a carbide, or an oxynitride layer. The melting can include localized topical heating of the precursor layer so as to melt the precursor layer while minimizing melting of the underlying substrate. After melting the precursor layer, the process can include a step 20 of cooling the melted precursor layer so that it crystallizes to form a scratch resistant crystallized layer. The flowchart of FIG. 1 is merely exemplary and can include additional steps. FIG. 2. illustrates an exemplary article 12 produced from the processes disclosed herein having a substrate 14 and a scratch-resistant crystallized layer 16.

In step 10 a precursor layer already formed on a substrate is melted. The substrate can be any thermally stable material having a need for a crystallized scratch resistant surface including, but not limited to, glass, ceramic, glass-ceramic, and metal. When the substrate is a glass, the glass can be, but is not limited to, silicates, aluminosilicates, borosilicates, alkali silicates, sodalime silicates, alkaline earth silicates, aluminoborosilicates, phosphosilicates, fused quartz, fused silica, high purity fused silica, oxynitride silicates, oxyhalide silicates, metallic silicates, and alkali-free silicates. The precursor layer formed on the surface can include, but is not limited to, an oxide, a nitride, a carbide, or an oxynitride. Examples of oxides include aluminum oxide, chromium oxide, magnesium aluminum oxide (spinel), ruby, and tantalum oxide. Examples of nitrides include silicon nitride, tungsten nitride, tantalum nitride, titanium nitride, boron nitride, silicon carbon nitride, and mixtures of multicomponent nitrides, such as titanium tungsten tantalum nitride. Examples of carbides include silicon carbide, titanium carbide, tungsten carbide, and mixtures of multicomponent carbides, such as titanium tungsten tantalum carbide. Examples of oxynitrides include silicon oxynitride, aluminum oxynitride, tungsten oxynitride, tantalum oxynitride, titanium oxynitride, and aluminum titanium oxynitride. The precursor layer can be formed using conventional formation and/or deposition processes including, but not limited to, slot-die coating, dip-coating, spin-coating, spray-coating, tape-casting, atomic layer deposition, plasma-enhanced chemical vapor deposition, chemical vapor deposition, molecular beam epitaxy, evaporative deposition, and sputter deposition. In some embodiments, when the precursor layer is a nitride, the precursor nitride layer can be formed by heating the substrate in an atmosphere containing a nitrogen source. In some embodiments, the nitrogen source can be ammonia, nitrogen gas, a chemically active nitrogen species (for example, methylamine or dimethlamine) and combinations thereof. For example, the atmosphere can be a mixture of ammonia and nitrogen gas. In some embodiments, the layer is formed/deposited without the use of an adhesive such that the substrate with the formed precursor layer thereon is not a laminate.

In some embodiments, the formed precursor layer is formed as a solid layer. In other embodiments, the formed precursor layer is deposited as a liquid, semi-liquid, or solution and then solidified prior to melting step 10. For example, the formed precursor layer can be applied as a sol gel solution and then annealed to solidify the layer.

In some embodiments, the formed precursor layer includes a plurality of individually formed precursor layers. A plurality of individual layers can be formed by repeating the formation/deposition process multiple times, for example when using a sol gel. In other embodiments, the formed precursor layer is single layer formed/deposited onto the substrate. In some embodiments, the thickness of the formed precursor layer, whether a single layer or a plurality of layers, is controlled to prevent mud cracking when the formed precursor layer is crystallized. In some embodiments, the formed precursor layer, whether a single layer or a plurality of layers, is thin and has a thickness of about 2,000 nm or less, 1,900 nm or less, 1,800 nm or less, 1,700 nm or less, 1,600 nm or less, 1,500 nm or less, 1,400 nm or less, 1,300 nm or less, 1,200 nm or less, or 1,100 nm or less, 1,000 nm or less, about 900 nm or less, about 800 nm or less, about 700 nm or less, about 600 nm or less, about 500 nm or less, about 400 nm or less, or about 300 nm or less.

Melting step 10 can include localized topical heating of the layer formed on the surface of the substrate. The term localized topical heating as used herein means directing heat to the top of the layer to melt it while minimizing heating and/or melting of the underlying substrate. Localize topical heating is not intended to include directing heat to the entire layer and substrate, for example by placing it in an oven or furnace. In some embodiments, the localized topical heating of the layer can be accomplished using a torch or a laser. Torches and lasers allow for controlling the application of the heat to the precursor layer rather than the substrate. Exemplary lasers can include excimer lasers, femtosecond lasers, picosecond lasers, chemical lasers, and carbon dioxide lasers. In some embodiments, the type of torch used depends upon the temperature the torch flame needs to be in order to melt the precursor layer. Torch flames can be a mixture of a fuel and an oxidizer. Exemplary fuels can include acetylene, butane, carbon monoxide, ethane, hydrogen, MAPP (methyl acetylene and propadiene), methane, natural gas, propane, and mixtures thereof. Exemplary oxidizers can include oxygen, air, nitrous oxides, halogens, and mixtures thereof. Exemplary torch flames can include a MAPP (methyl acetylene and propadiene)—air flame, a propane-air flame, or a hydrogen-oxygen flame. The gases used in the flame can be adjusted to reach a desired temperature for the flame, for example by adjusting the fuel to oxidizer ratio. The temperature of the applied heat is at least the melting temperature of the layer and depends upon the content of the layer material. In some embodiments, the temperature of the heat applied during the melting step is in a range from about 1,500° C. to about 3,500° C. Melting points for exemplary layers include 2,030-2,050° C. for aluminum oxide, 2,135° C. for spinel, 1,872° C. for tantalum oxide, 2,435° C. for chromium oxide, and 3,090° C. for tantalum nitride.

In some embodiments the localized topical heating of melting step 10 occurs rapidly in order to minimize indirect heating/melting of the underlying substrate. For example, in some embodiments the localized topical heating needed to melt the precursor layer is for a duration of about 2 minutes or less, about 1 minute or less, about 50 seconds or less, about 40 seconds or less, about 30 seconds or less, about 20 seconds or less, about 10 seconds or less, or about 5 seconds or less. In some embodiments, the localized topical heat was applied at a rate of about 2 cm/sec or less, about 1.75 cm/sec or less, about 1.5 cm/sec or less, about 1.25 cm/sec or less, about 1 cm/sec or less, about 0.75 cm/sec or less, about 0.5 cm/sec or less, or about 0.25 cm/sec or less. In some embodiments, the heat source can be moved in a controlled manner, such as by robotic rastering, over the precursor layer section by section wherein each section is exposed to the heat source for the duration mentioned above. The rapid heating in conjunction with the localized topical heating of the formed precursor layer minimizes and/or prevents damage or warpage of the underlying substrate. In some embodiments, the distance between the heat source and the precursor layer can also be adjusted to minimize and/or prevent damage or warpage of the underlying substrate.

Cooling step 20 includes allowing the melted layer to crystallize and densify to form scratch-resistant crystallized layer 16. In some embodiments, the melted layer cools in ambient air. In some embodiments, the rate of cooling the melted layer can be controlled. The scratch-resistant crystallized layer 16 can have a hardness of about 5 GPa or greater, about 10 GPa or greater, about 15 GPa or greater, about 20 GPa or greater, about 25 GPa or greater, or about 30 GPa or greater. The hardness can be measured by nanoindentation using a diamond Berkovich tip. A continuous stiffness method as implemented with the Agilent G2000 nanoindenter can be used wherein a small sinusoidal displacement signal (1 nm amplitude at 45 Hz) is superimposed on the tip as it is loaded into the crystallized layer. This testing method permits continuous determination of hardness and modulus as a function of indentation depth so as to isolate and extract the properties of the crystallized layer itself free of the influence of the underlying substrate. In some embodiments, the crystallized layer has a greater hardness/scratch resistance than the precursor layer.

In some embodiments, the process of melting step 10 and cooling step 20 can be part of a continuous process. For example, the substrate with the formed precursor layer can be provided in a roll, unrolled and moved through a melting station and a cooling station, and then rolled up again once the crystallized layer is formed. In other embodiments, the formed precursor layer can be formed as part of the continuous process such that the substrate is proved in a roll and the process includes a deposition or formation station for forming the formed precursor layer.

In some embodiments, the crystallized layer 16 can be transparent and have an optical transmission about 75% or greater, about 80% or greater, about 85% or greater, about 87% or greater, about 90% or greater, about 93% or greater, or about 95% or greater in a wavelength range from 400 nm to 800 nm. A transparent crystallized layer that is transparent is useful for applications where substrate 14 is a cover substrate for a mobile electronic device or a display substrate for an electronic device where the ability to see through the crystallized layer and substrate are necessary. In other embodiments, the crystallized layer can be colored and have an optical transmittance of less than about 75% in a wavelength range from 400 nm to 800 nm.

In some embodiments, the crystallized layer is thin and has a thickness of about 2,000 nm or less, 1,900 nm or less, 1,800 nm or less, 1,700 nm or less, 1,600 nm or less, 1,500 nm or less, 1,400 nm or less, 1,300 nm or less, 1,200 nm or less, or 1,100 nm or less, 1,000 nm or less, about 900 nm or less, about 800 nm or less, about 700 nm or less, about 600 nm or less, about 500 nm or less, about 400 nm or less, or about 300 nm or less. In some embodiments, the thickness of the crystallized layer is controlled, by controlling the thickness of the precursor layer, to ensure the crystallized layer has a desired density and purity. The density or compactness of the crystals impacts the scratch resistance and hardness of the crystallized layer—the smaller the spacing between the crystals, the greater the scratch resistance. The thicker the precursor layer and crystallized layer, the greater the chance that the substrate will be heated sufficiently to have atoms from the substrate move into the melted precursor layer, thereby lowering the purity of the crystallized layer. In some embodiments, the crystallized layer can have a purity of a desired crystal that is about 90 wt % or greater, about 95 wt % or greater, about 97 wt % or greater, about 99 wt % or greater, about 99.5 wt % or greater or about 99.9 wt %.

In some embodiments, the formed precursor layer is amorphous and crystallizes after the formed precursor layer is subjected to melting step 10 and cooling step 20. In some embodiments, the formed precursor layer is crystalline but is crystallized into a different form after the formed precursor layer is subjected to melting step 10 and cooling step 20. In some embodiments, the formed precursor layer is aluminum oxide, for example amorphous aluminum oxide, which is crystallized to form an alpha-aluminum oxide, also known as corundum. In some embodiments, the corundum is transparent and has an optical transmittance about 75% or greater, about 80% or greater, about 85% or greater, about 87% or greater, about 90% or greater, about 93% or greater, or about 95% or greater in a wavelength range from 400 nm to 800 nm. In other embodiments the formed precursor layer and crystallized layer are different forms of magnesium aluminum oxide, tantalum oxide, chromium oxide, or titanium oxide (rutile).

In some embodiments, an aluminum oxide layer is formed on the substrate from a sol gel and crystallized into corundum. In such embodiments, the sol gel can be formed form an aluminum salt, for example aluminum chloride, or an aluminum alkoxide disposed in a polar aprotic solvent, for example dimethylformamide (DMF) ("Solution A"). Solution A can have a molarity of about 0.25 M, about 0.5 M, about 1 M, about 1.5 M, about 2 M, about 2.5 M, about 3 M, about 3.5 M, about 4 M, about 4.5 M, about 5 M, or greater. In some embodiments, Solution A can be a 1M solution of aluminum chloride in DMF. In some embodiments, Solution A can be mixed with a Solution B to form the sol gel. Solution B can include a chloride salt, for example gallium chloride or chromium chloride, an alkoxide, acid, for example nitric acid, or a base disposed in a polar aprotic solvent, for example DMF. Solution B can have a molarity of about 0.25 M, about 0.5 M, about 1 M, about 1.5 M, about 2 M. Solutions A and B can be mixed to achieve a desired concentration of aluminum. For example, in some embodiments Solution A can be a 1M solution of aluminum chloride in DMF and Solution B can be a 0.25M solution of chromium chloride in DMF. In other embodiments, Solution A can be a 1M solution of aluminum chloride in DMF and Solution B can be a 1 M solution of nitric acid in DMF. In some embodiments, the sol gel solution can also contain seed agents or chemical agents, for example alumina or gallium seed nanoparticles for enhancing crystallization and lowering the melting temperature required in the melting step 10. In some embodiments, the sol gel solution can also contain graphene, single-walled carbon nanotubes (swcnt), multi-walled carbon nanotubes (mwcnt), semiconductor nanoparticles, or metal nanoparticles to facilitate reduced coefficient of friction and increased hardness in the crystallized layer.

In some embodiments, where a sol gel solution is used, the sol gel solution can be deposited on the substrate using conventional deposition techniques including, but not limited to, slot-die coating, spin-coating, spray-coating, dip-coating, or tape-casting. After deposition, the sol gel solution can be annealed to form a solid formed precursor layer which is subsequently melted and cooled to form the crystallized layer 16. In some embodiments, the process of sol-gel solution deposition and annealing can be repeated one or more times to increase the thickness of the formed precursor layer.

EXAMPLES

Various embodiments will be further clarified by the following examples.

Example 1

Figure 3:
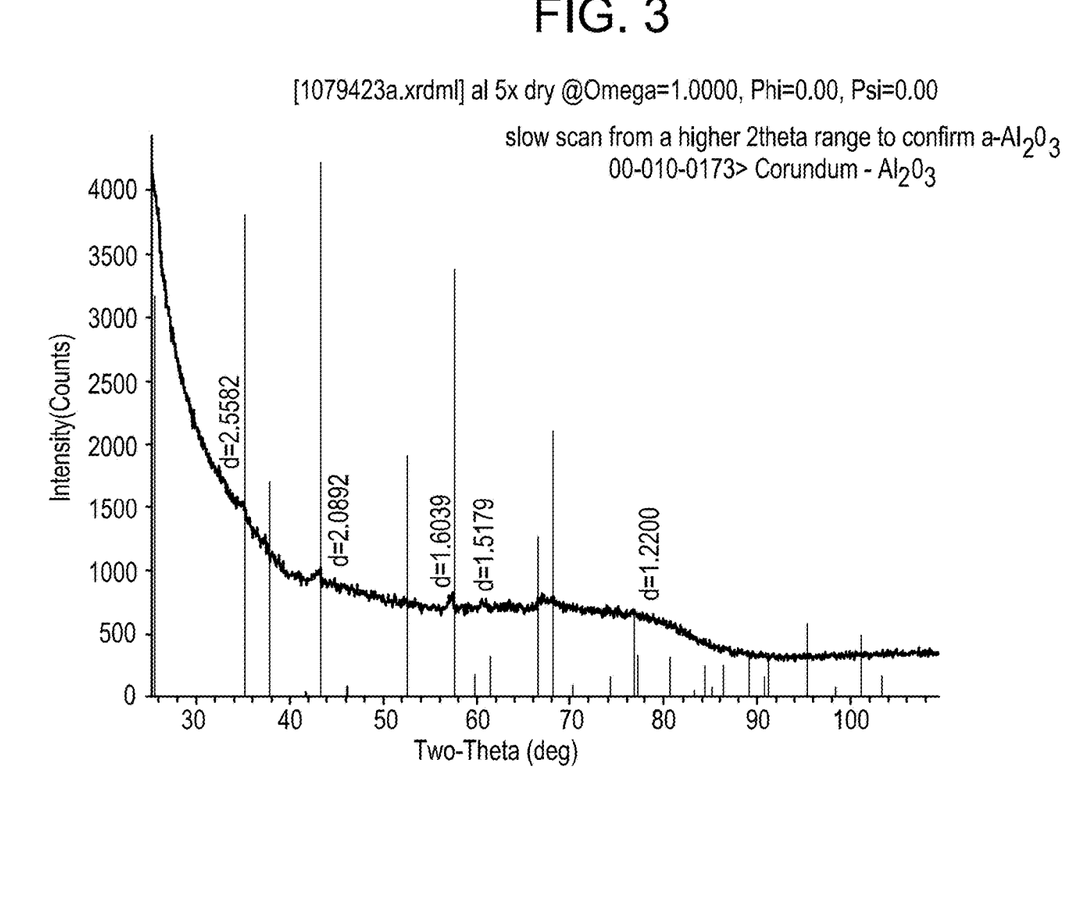
FIG. 3 is a plot of the GIXRD results of an exemplary corundum layer.

A sol gel comprising 1M aluminum chloride solution in DMF was deposited on a HPFS® glass substrate and heated to about 2,000° C. with a MAPP/air flame to anneal the layer. This process was repeated until 5 layers of the solution were deposited and annealed. This resulted in an amorphous aluminum oxide layer on the glass substrate having a thickness between 150 nm and 200 nm. The aluminum oxide layer was then locally heated to about 3200° C. with a hydrogen/oxygen flame under ambient environmental conditions for approximately 30 seconds in a checked box type of manual movement to melt the aluminum oxide layer. The melted aluminum oxide layer was then cooled and crystallized into alpha aluminum oxide (corundum) having a thickness between 150 nm and 200 nm. The presence of corundum was confirmed using GIXRD (Grazing Incidence X-ray Diffraction). FIG. 3 is a plot of the GIXRD analysis as a plot of Two-Theta (degrees) vs. intensity (count) showing the presence of corundum.

Example 2

Figure 4:
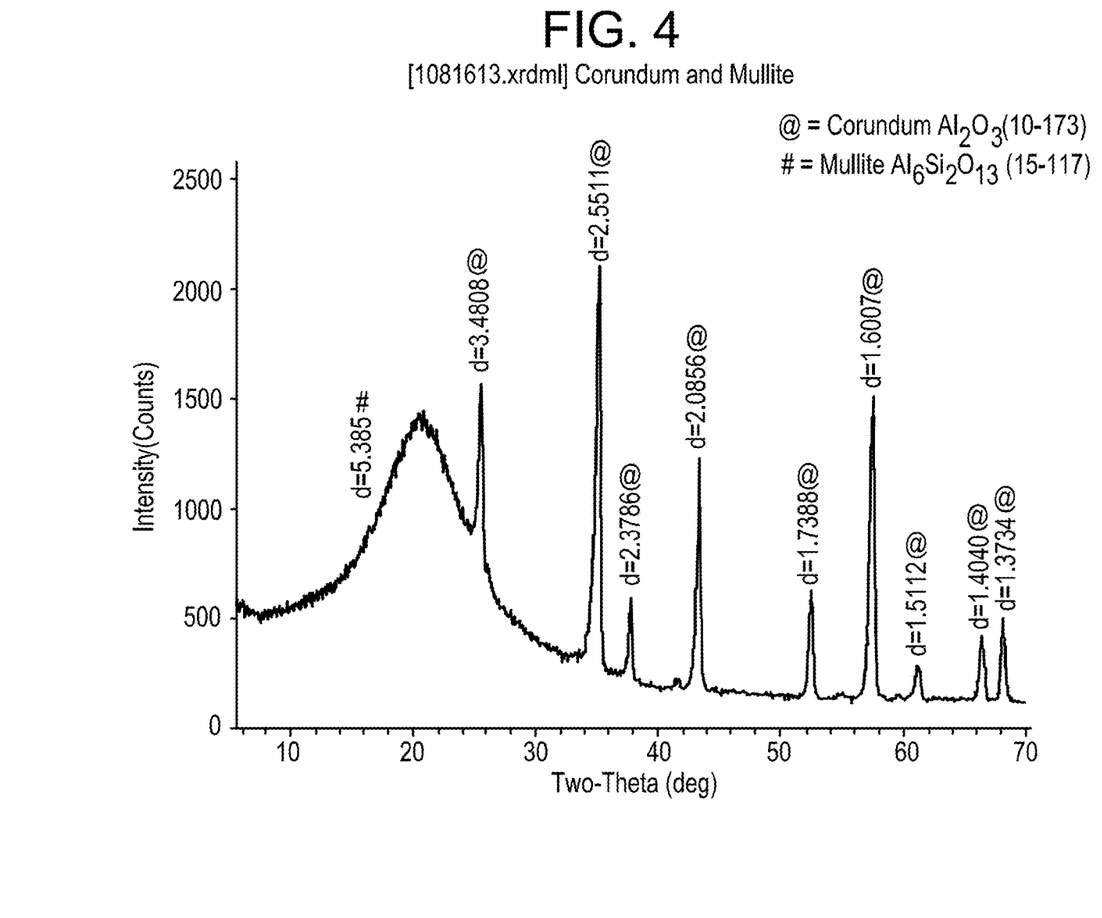
FIG. 4 is a plot of the GIXRD results of an exemplary corundum layer.

A sol gel comprising 1M aluminum chloride solution in DMF mixed in a 1:1 ratio with a 1M nitric acid solution was spun coated on an EAGLE XG® glass substrate and heated to about 2,000° C. with a MAPP/air flame to anneal the layer. This process was repeated until 15 layers of the solution were deposited and annealed. This resulted in an amorphous aluminum oxide layer on the glass substrate having a thickness between 1,000 nm and 1,200 nm. The aluminum oxide layer was then locally heated to about 3200° C. with a hydrogen/oxygen flame under ambient environmental conditions for approximately 30 seconds in a checked box type of manual movement to melt the aluminum oxide layer. The melted aluminum oxide layer was then cooled and crystallized into an alpha aluminum oxide (corundum) having a thickness between 1,000 nm and 1,200 nm. The presence of corundum was confirmed using GIXRD (Grazing Incidence X-ray Diffraction). FIG. 4 is a plot of the GIXRD analysis as a plot of Two-Theta (degrees) vs. intensity (count) showing the presence of corundum as well as mullite. However, the glass substrate was partially melted due to the high heat of the hydrogen/oxygen flame and the grain size of the crystals were large resulting in a crystallized layer that was hazier than the crystallized layer formed in Example 1. It is believed that the thicker the amorphous aluminum oxide layer, the more heat that is needed to melt the amorphous aluminum oxide layer and consequently the more likely that the glass substrate will melt. It is also believed that increased thickness and increase heat allows for some of the corundum converts to mullite, which adds to the haziness of the crystallized layer.

The above process was repeated with forming an amorphous aluminum oxide layer of approximately 300 nm (5 layers), approximately 500 nm (10 layers), and approximately 900 nm (16 layers). An amorphous aluminum oxide layer of 500 nm or less was found to enable facile melting of the amorphous aluminum oxide layer on the glass without significantly affecting the substrate structure or purity of the final corundum film. The balance between glass substrate softening or melting and the thickness of the crystallized layer results in a glass substrate with an outer layer of clear corundum which is especially hard to scratch.

Example 3

Figure 5:
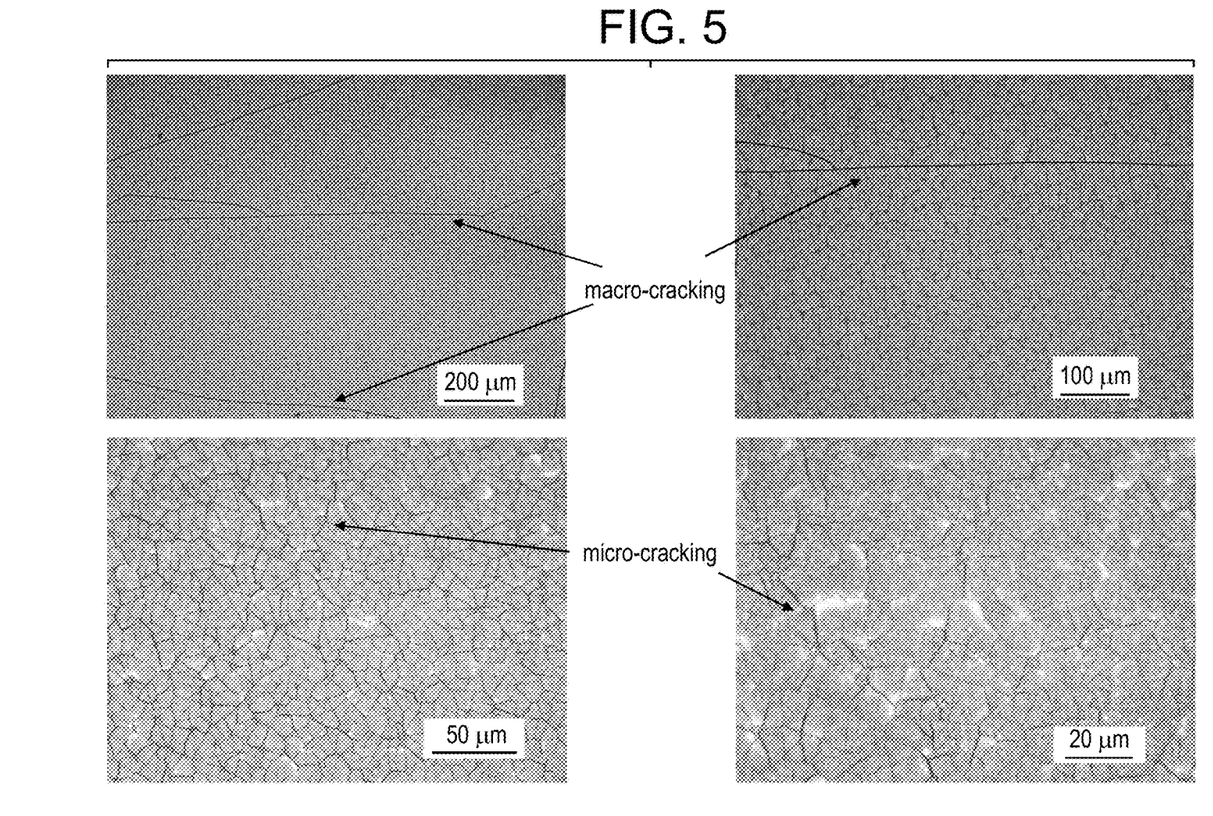
FIG. 5 shows the presence of mud-cracking of an exemplary corundum layer on a macro-scale and a micro-scale.
Figure 6:
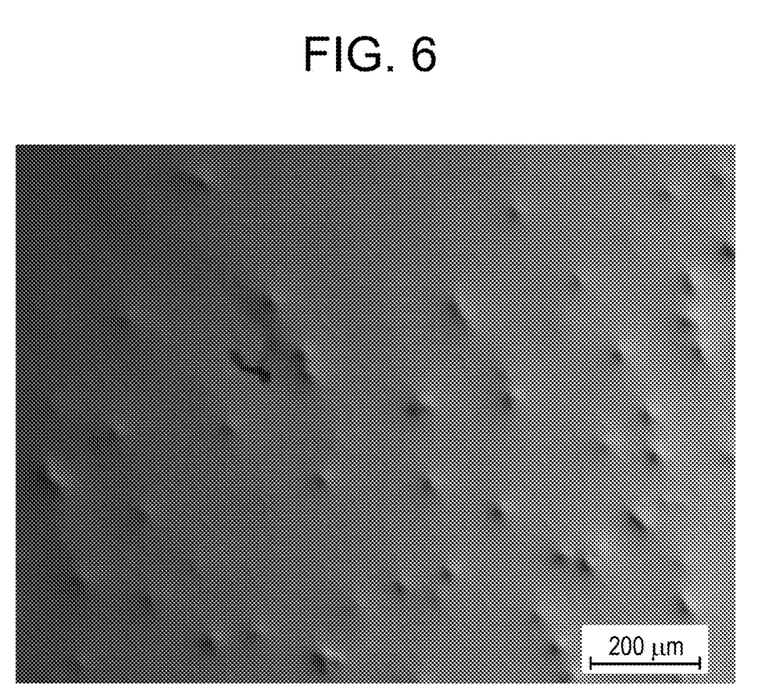
FIG. 6 shows the absence of mud-cracking of an exemplary corundum layer on a micro-scale.

A 14 layer corundum film and a 6 layer corundum film were formed according to the process of Example 1. The 16 layer corundum film exhibited considerable mud-cracking on both the macro-scale (200 μm and 100 μm) and the micro-scale (50 μm and 20 μm) as shown in FIG. 5. However, the 6 layer corundum film exhibited considerably less mud-cracking as shown in FIG. 6. Thus the thickness of the corundum layer affects the variability in surface hardness across the corundum layer, with thicker layers having greater variability.

It will be apparent to those skilled in the art that various modifications and variations can be made without departing from the spirit or scope of the invention.

What is claimed is:

1. A method for forming a crystallized layer comprising:
   melting a precursor layer formed on a surface of a substrate, wherein the precursor layer is selected from the group consisting of an oxide, a nitride, a carbide, and an oxynitride, the melting comprising localized topical heating of the precursor layer; and
   cooling the melted precursor layer so that it crystallizes to form a crystallized layer,
   wherein the hardness of the crystallized layer is greater than or equal to 15 GPa.

2. The method of claim 1, wherein the localized topical heating is applied at a rate in a range from about 0.25 cm/sec to about 2 cm/sec.

3. The method of claim 1, wherein the localized topical heating comprises heating the precursor layer with a laser.

4. The method of claim 1, wherein the localized topical local heating comprises heating the precursor layer with a torch.

5. The method of claim 4, wherein the torch is a hydrogen-oxygen torch.

6. The method of claim 1, wherein the precursor layer is an oxide selected from the group consisting of aluminum oxide, magnesium aluminum oxide, tantalum oxide, and chromium oxide.

7. The method of claim 1, wherein the precursor layer is amorphous aluminum oxide.

8. The method of claim 7, wherein the amorphous aluminum oxide crystallizes into corundum.

9. The method of claim 7, wherein the amorphous aluminum oxide crystallizes into ruby.

10. The method of claim 1, wherein the substrate is selected from the group consisting of glass, ceramic, glass-ceramic, and metal.

11. The method of claim 1, further comprising depositing the precursor layer on the substrate.

12. The method of claim 11, wherein the depositing is selected from the group consisting of slot-die coating, dip-coating, spin-coating, spray-coating, tape-casting, atomic layer deposition, plasma-enhanced chemical vapor deposition, chemical vapor deposition, molecular beam epitaxy, evaporative deposition and sputter deposition.

13. The method of claim 1, wherein the optical transmittance of the crystallized layer is 85% or greater in a wavelength from 400 nm to 800 nm.

14. The method of claim 1, further comprising providing the substrate in a roll and performing the melting and cooling as a continuous process.

15. A method for forming a crystallized layer comprising:
   depositing an oxide layer on a substrate;
   localized topical heating of the oxide layer to melt the oxide layer; and
   cooling the melted oxide layer so that it crystallizes to form a crystallized layer,
   wherein the hardness of the crystallized layer is greater than or equal to 15 GPa.

16. The method of claim 15, wherein the oxide layer is selected from the group consisting of aluminum oxide, magnesium aluminum oxide, tantalum oxide, and chromium oxide.

17. The method of claim 15, wherein the depositing comprises applying a sol gel to the substrate.

18. The method of claim 17, further comprising annealing the deposited sol gel.

19. The method of claim 18, further comprising repeating the depositing and annealing to form a plurality of oxide layers.

20. The method of claim 15, wherein the oxide layer is amorphous aluminum oxide.

21. The method of claim 20, wherein amorphous aluminum oxide crystallizes into corundum.

22. The method of claim 15, the localized topical heating is applied at a rate in a range from about 0.25 cm/sec to about 2 cm/sec.

23. The method of claim 15, wherein the localized topical heating comprises heating the layer with a laser.

24. The method of claim 15, wherein the localized topical heating comprises heating the layer with a torch.

25. The method of claim 24, wherein the torch is a hydrogen-oxygen torch.

26. The method of claim 15, wherein the substrate is selected from the group consisting of glass, ceramic, glass-ceramic, and metal.

27. The method of claim 15, wherein the depositing is selected from the group consisting of slot-die coating, dip-coating, spin-coating, spray-coating, tape-casting, atomic layer deposition, plasma-enhanced chemical vapor deposition, chemical vapor deposition, molecular beam epitaxy, evaporative deposition and sputter deposition.

28. The method of claim 15, wherein the optical transmittance of the crystallized layer is 85% or greater in a wavelength from 400 nm to 800 nm.

29. The method of claim 15, further comprising providing the substrate in a roll and performing the melting and cooling as a continuous process.

30. The method of claim 15, wherein the crystallized layer has a thickness of about 1,000 nm or less.

31. An article comprising:
a substrate; and
a crystallized layer comprising corundum and having a hardness of 15 GPa or greater formed on a surface of the substrate, wherein the optical transmittance of the crystallized layer is 85% or greater in a wavelength from 400 nm to 800 nm.

32. The article of claim 31, wherein the crystallized layer has a thickness of about 2,000 nm or less.

33. The article of claim 31, wherein the crystallized layer has a thickness of about 1,000 nm or less.

34. The article of claim 31, wherein the crystallized layer has thickness of about 600 nm or less.

35. A method for forming a crystallized layer comprising:
depositing an oxide layer on a substrate;
localized topical heating of the oxide layer to melt the oxide layer; and
cooling the melted oxide layer so that it crystallizes to form a crystallized layer,
wherein the oxide layer is amorphous aluminum oxide and crystallized into corundum or ruby.

* * * * *